United States Patent [19]

Davari et al.

[11] Patent Number: 4,881,105
[45] Date of Patent: Nov. 14, 1989

[54] INTEGRATED TRENCH-TRANSISTOR STRUCTURE AND FABRICATION PROCESS

[75] Inventors: Bijan Davari, Mahopac; Wei Hwang, Armonk; Nicky C. Lu, Yorktown Heights, all of N.Y.

[73] Assignee: International Business Machines Corporation, Armonk, N.Y.

[21] Appl. No.: 206,148

[22] Filed: Jun. 13, 1988

[51] Int. Cl.[4] ...................... H01L 27/08; H01L 29/78
[52] U.S. Cl. .................................. 357/23.4; 357/42; 357/46; 357/49; 357/55; 357/72; 357/54
[58] Field of Search .................... 357/23.4, 55, 42, 49, 357/54, 46; 437/203, 72

[56] References Cited

U.S. PATENT DOCUMENTS

| | | | |
|---|---|---|---|
| 3,893,155 | 7/1975 | Oglue | 357/42 |
| 4,131,907 | 12/1978 | Ouyang | 357/42 |
| 4,250,519 | 2/1981 | Mogi et al. | 357/23.4 |
| 4,319,932 | 3/1982 | Jambotkar | 148/1.5 |
| 4,454,647 | 6/1984 | Joy et al. | 29/576 W |
| 4,455,740 | 6/1984 | Iwai | 29/571 |
| 4,509,991 | 5/1985 | Taur | 148/1.5 |
| 4,517,731 | 5/1985 | Khan et al. | 29/571 |
| 4,523,369 | 6/1985 | Nagakubo | 29/576 W |
| 4,541,001 | 9/1985 | Schutten | 357/53 |
| 4,546,535 | 10/1985 | Shepard | 437/203 |
| 4,578,128 | 3/1986 | Mundt et al. | 307/42 |
| 4,636,281 | 1/1987 | Burjuey et al. | 357/55 |
| 4,670,768 | 6/1987 | Sunami et al. | 357/42 |
| 4,767,722 | 8/1988 | Blanchard | 357/23.4 |

FOREIGN PATENT DOCUMENTS 0003287 1/1983 Japan.
2020129 11/1979 United Kingdom .................. 357/42

Primary Examiner—Andrew J. James
Assistant Examiner—Jackson, Jr. Jerome
Attorney, Agent, or Firm—John J. Goodwin

[57] ABSTRACT

An integrated, self-aligned trench-transistor structure including trench CMOS devices and vertical "strapping transistors" wherein the shallow trench transistors and the strapping trench-transistors are built on top of buried source junctions. A p− epitaxial layer is grown on a substrate and contains an n-well, an n+ source and a p+ source regions. Shallow trenches are disposed in the epitaxial layer and contain n+ polysilicon or metal, such as tungsten, to provide the trench CMOS gates. A gate contact region connects the trenches and the n+ polysilicon or metal in the trenches. The n+ polysilicon or metal in the trenches are isolated by a thin layer of silicon dioxide on the trench walls of the gates. The p+ drain region, along with the filled trench gate element and the p+ source region, form a vertical p-channel (PMOS) trench-transistor. The n+ drain region, along with filled trench gate element and the n+ source form a vertical n-channel (NMOS) transistor. The PMOS and NMOS trench transistors are isolated by shallow trench isolation regions and an oxide layer.

11 Claims, 21 Drawing Sheets

FIG. 20
FIG. 21
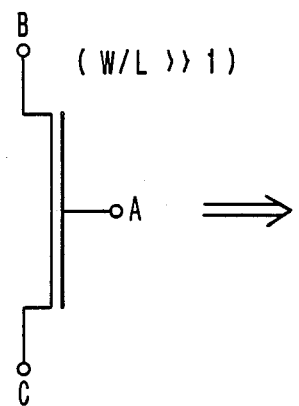
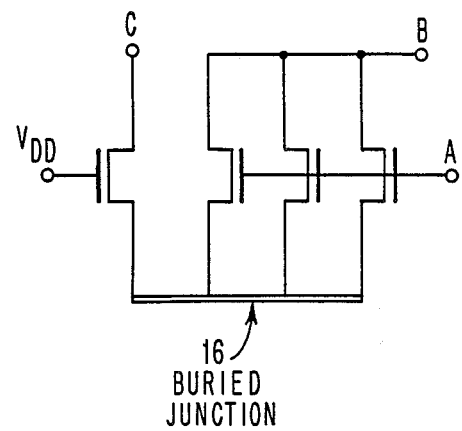
16
BURIED
JUNCTION

INTEGRATED TRENCH-TRANSISTOR STRUCTURE AND FABRICATION PROCESS

BACKGROUND OF THE INVENTION

1. Field of the Invention

The present invention relates to complementary metal-oxide-semiconductor (CMOS) fabrication methods and devices and, more particularly, to the fabrication and structure of vertical trench CMOS devices for integrated circuits.

2. Description of the Prior Art

U.S. Pat. No. 4,670,768 issued June 2, 1987 to Sunami et al, entitled COMPLEMENTARY MOS INTEGRATED CIRCUITS HAVING VERTICAL CHANNEL FETS, describes a CMOS having a vertical channel with a gate metal disposed vertically in a groove. More specifically, a semiconductor integrated circuit is described comprising semiconductor regions in the form of first and second protruding poles that are provided on a semiconductor layer formed on a semiconductor substrate or an insulating substrate, and that are opposed to each other with an insulating region sandwiched therebetween a p-channel FET provided in the first semiconductor region, and an n-channel FET provided in the second semiconductor region. These FET's have source and drain regions on the upper and bottom portions of the semiconductor regions, and have gate electrodes on the sides of the semiconductor regions. The insulation region between the protruding pole-like semiconductor regions is further utilized as the gate electrode and the gate insulating film.

A U-MOSET with a vertical channel is shown in Japanese patent JA0003287 issued Jan. 10, 1983 to Furumura, entitled VERTICAL CYLINDRICAL MOS FIELD EFFECT TRANSISTOR, more particularly, to improve the integration of an MOS field effect transistor and to form a flat structure for forming a source region and a drain region in the end surface of vertical hollow cylindrical insulating layer buried with a gate electrode, an insulating layer is formed in a vertical hollow cylindrical shape sequentially with bottom regions to become drain or source formed in contact with or above the outside surface.

In U.S. Pat. No. 4,319,932 issued Mar. 16, 1982 to Jambotkar, entitled METHOD OF MAKING HIGH PERFORMANCE BIPOLAR TRANSISTOR WITH POLYSILICON BASE CONTACTS, the step of doping a substrate from a deposited polysilicon layer is shown. Bipolar transistor devices are formed by employing polysilicon base contacts self-aligned with respect to a diffusion or ion implantation window used to form emitter, intrinsic base and raised subcollector regions. The polysilicon acts as a self-aligned impurity source to form the extrinsic base region therebelow and, after being coated with silicon dioxide on its surface and along the sidewalls of the diffusion or ion implantation window, as a mask. Directional reactive ion etching is used to form a window in the silicon dioxide while retaining it along the sidewalls. Ion implantation, for example, may be used to form, through the window, an emitter, intrinsic base and raised subcollector region. The silicon dioxide is used as an insulator to separate the emitter contact from polysilicon.

U.S. Pat. No. 4,523,369 issued June 18, 1985 to Nagakubo et al, entitled METHOD FOR MANUFACTURING A SEMICONDUCTOR DEVICE, shows a method including the step of forming a sidewall layer which is used for defining a trench. The method for manufacturing more particularly includes the steps of: forming a first mask member which has an opening to expose a desired portion of one major surface of a semiconductor substrate, doping an impurity which has the same conductivity type as that of the semiconductor substrate through the opening of the first mask member to form an impurity region of a high concentration in the surface layer of the semiconductor substrate; forming second mask member on the side surface of the opening of the first mask member while the first mask member is left as it is; forming a groove by selectively etching the semiconductor substrate using the first and second mask members, and at the same time leaving an impurity region of the high concentration at least on the side surface of the groove; and burying an insulating isolation material in the groove.

Other patents related to the field of FETs, CMOS, V-grooves and trenches include the following:

U.S. Pat. No. 4,509,991 issued Apr. 9, 1985 to Taur, entitled SINGLE MASK PROCESS FOR FABRICATING CMOS STRUCTURE;

U.S. Pat. No. 4,517,731 issued May 21, 1985 to Khan et al, entitled DOUBLE POLYSILICON PROCESS FOR FABRICATING CMOS INTEGRATED CIRCUITS;

U.S. Pat. No. 4,455,740 issued June 26, 1984 to Iwai, entitled METHOD OF MANUFACTURING A SELF-ALIGNED U-MOS SEMICONDUCTOR DEVICE;

U.S. Pat. No. 4,541,001 issued Sept. 10, 1985 to Schutten et al, entitled BIDIRECTIONAL POWER FET WITH SUBSTRATE-REFERENCED SHIELD;

U.S. Pat. No. 4,454,647 issued June 19, 1984 to Joy et al, entitled ISOLATION FOR HIGH DENSITY INTEGRATED CIRCUITS;

U.S. Pat. No. 3,893,155 issued July 1, 1975 to Ogiue, entitled COMPLEMENTARY MIS INTEGRATED CIRCUIT DEVICE ON INSULATING SUBSTRATE;

U.S. Pat. No. 4,131,907 issued Dec. 26, 1978 to Ouyang, entitled SHORT-CHANNEL V-GROOVE COMPLEMENTARY MOS DEVICE.

SUMMARY OF THE INVENTION

An object of the present invention is to provide structure and fabrication process for an integrated self-aligned CMOS trench-transistor employing a vertical trench strapping transistor t bias the buried source of vertical CMOS devices.

Another object of the present invention is to provide structure and fabrication process for an integrated trench-transistor device for high density VLSI applications.

Another object of the present invention is to provide a three-dimensional integrated transistor structure which has a vertical transistor built on the surfaces of a U-groove between the surface of the silicon and a buried source junction beneath the U-groove.

Another object of the present invention is to provide an improved fabrication process for providing a self-aligned silicide layer on a silicon surface and interconnection layer and over predefined contacts and interconnection layer, which forms a self-aligned contact connection.

Another object of the present invention is to provide an improved fabrication process for providing small coupling capacitances between the gate and drain junctions by using the side-wall spacer technology.

Still another object of the present invention is to provide an improved fabrication process for providing a flat topography structure after forming gate level and then several additional levels of interconnection metallurgy can be easily added.

Another object of the present invention is to provide a fabrication method for a vertical transistor where only one contact area for drain junction is needed, the other gate and source contacts are contained within the same area.

A further object of the present invention is to provide a layout method using the buried junction as common source.

A further object of the present invention is to provide a vertical strapping transistor and vertical CMOS transistors combination for use as an inverter circuit.

Still another object of the present invention is to provide a vertical strapping transistor and vertical CMOS transistors combination for use as a NOR gate.

Another object of the present invention is to provide a vertical strapping transistor and vertical CMOS transistors combination for use as a NAND gate.

And another object of the present invention is to provide an interdigitated layout for vertical CMOS transistors.

The foregoing and other objects, features and advantages of the invention will be apparent from the following more particular description of the invention as illustrated in the accompanying drawings.

DESCRIPTION OF THE DRAWINGS

FIGS. 20 and 21 are schematic drawings of a vertical MOS transistor structure for interdigit layout.

DESCRIPTION OF THE PREFERRED EMBODIMENTS

Figure 1:
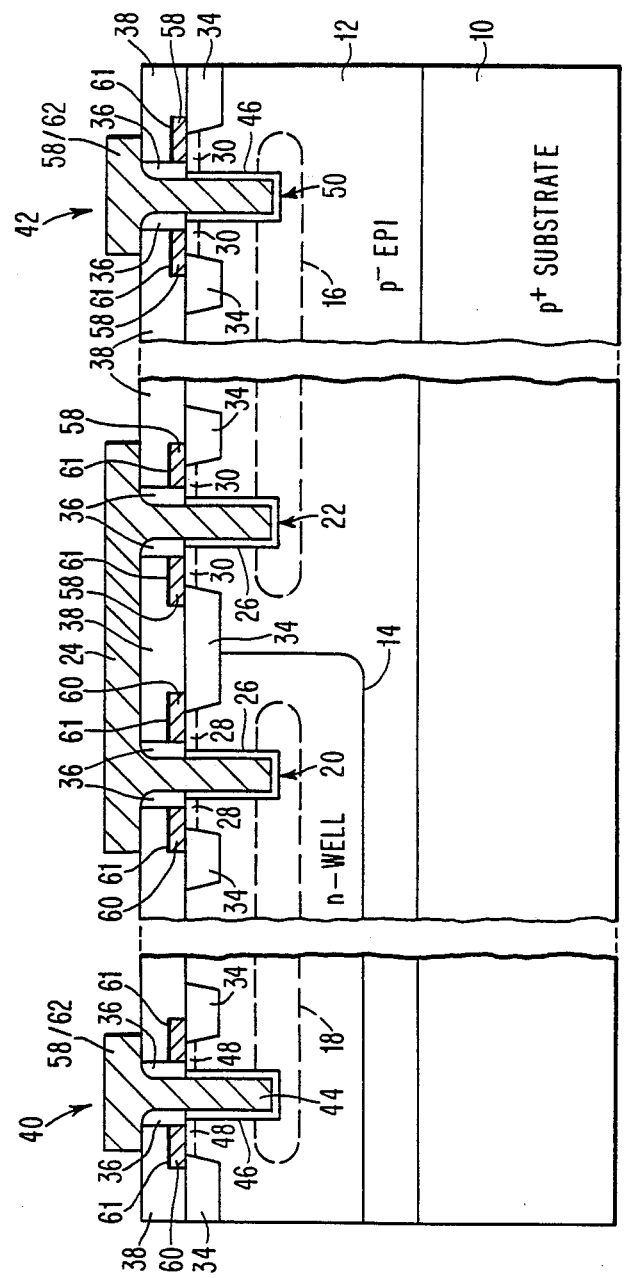
FIG. 1 is a schematic illustration of a vertical cross section of an embodiment of a trench-transistor CMOS structure according to the principles of the present invention.
Figure 2:
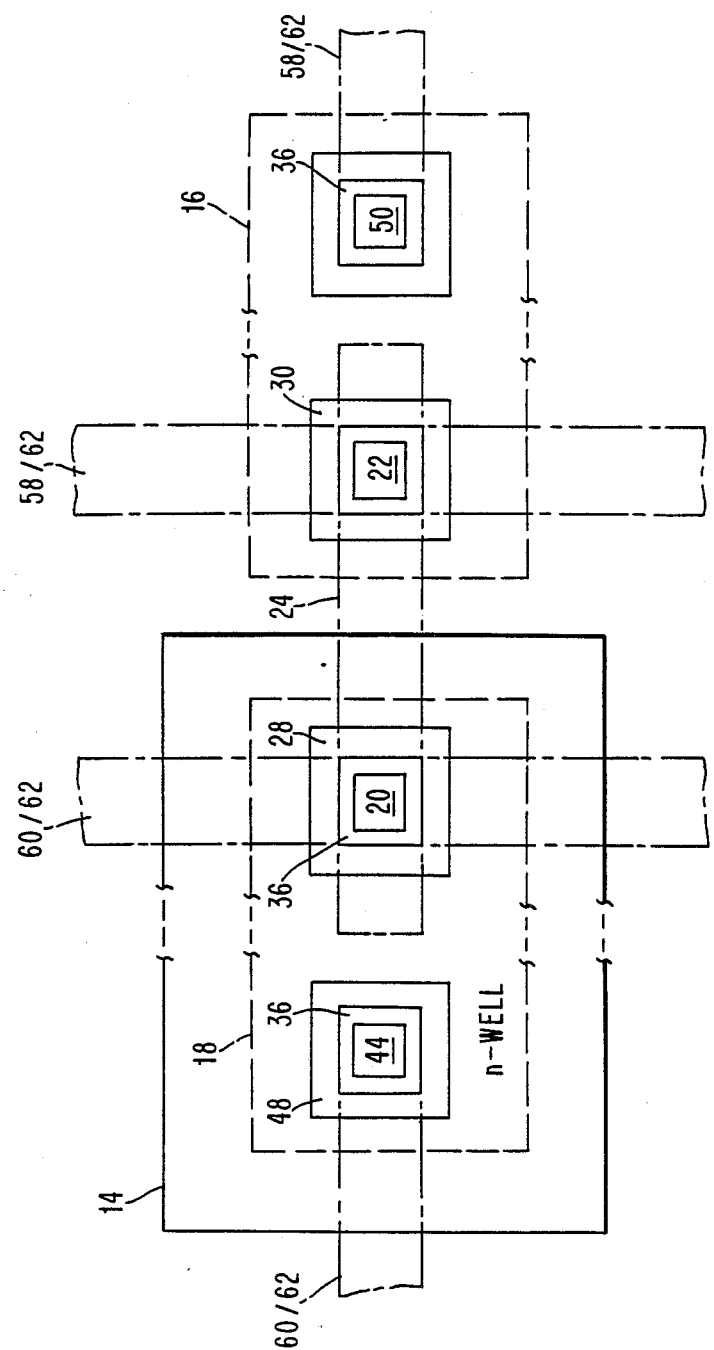
FIG. 2 is a schematic illustration of a horizontal cross section of the trench-transistor CMOS structure of FIG. 1.

In present VLSI technology, three dimensional active devices have demonstrated significant advantages. In FIG. 1, a new design of an integrated, self-aligned trench-transistor technology is illustrated. The use of a vertical trench-transistor called "strapping transistor", to bias the common buried source of the vertical transistor is also described. The cross section of this new concept of trench CMOS device and vertical "strapping transistor" is shown in FIG. 1 and a plan view of the structure of FIG. 1 is shown in FIG. 2. The shallow trench-transistors and the strapping trench-transistors are built on top of the buried source junctions. The layout of this structure provides the advantages of flexibility in the biasing of buried junctions in integrated circuit technology. The circuit layout designs are no longer necessary for the use of the substrate to serve as the common terminal. The interdigated layout technique using vertical transistors and CMOS devices can be achieved successfully. This technique provides higher packing density for circuit layout design.

More particularly, the embodiment illustrated in FIG. 1 includes a substrate 10. The structure of FIG. 1 will be described with specific conductivities provided for example, substrate 10 may be p+, however, one skilled in the art will know that the p, n and signal polarities may be different in other embodiments.

A p− epitaxial layer 12 is grown on substrate 10 and contains n-well 14, an n+source 16 and p+ source 18 regions. Shallow trenches 20 and 22 are disposed in epitaxial layer 12 and contain n+ polysilicon 58 or metal, such as tungsten 62, to provide the trench CMOS gates. A gate contact region 24 connects trenches 20 and 22 and the n+ polysilicon 58 or metal 62 in trenches 20 and 22. The n+ polysilicon 58 or metal 62 in trenches 20 and 22 are isolated by a thin layer 26 of silicon dioxide on the trench walls of the gates. The p+ drain region 28, along with filled trench gate element 24 and p+ source region 18, form a vertical p-channel (PMOS) trench-transistor.

Likewise, the n+ drain region 30, along with filled trench gate element 24 and n+ source 16 form a vertical n-channel (NMOS) trench-transistor. The PMOS and NMOS trench-transistors are isolated by shallow trench isolation regions 34 and an oxide layer 38 disposed over the epitaxial layer 12.

An important feature of the PMOS and NMOS trench-transistors is the silicon nitride spacer regions 36 and the self-aligned feature of the contiguous drain regions 28 and 30.

The structure of FIG. 1 further includes the vertical trench strapping transistors 40 and 42. Vertical trench-transistor 40 includes a vertical trench 44 filled with n+ polysilcon 58 or metal such as tungsten 62 which extends to the p+ source region 18. The trench 44 is lined with thin gate oxide 46. Strapping transistor 40 is a vertical PMOS trench-transistor which includes p+ drain regions 48 along with filled trench gate element 44 and p+ source region 18 and further includes nitride spacers 36 and shallow trench isolation regions 34. Strapping transistor 42 is a vertical NMOS trench-transistor which includes n+ drain regions 30 along with filled trench gate element 50 with n+ polysilicon 58 or metal such as tungsten 62 which extends to the n+source region 16. The trench 50 is lined with thin gate oxide 46. Strapping transistor 42 further includes nitride spacers 36 and shallow trench isolation regions 34.

Figure 3:
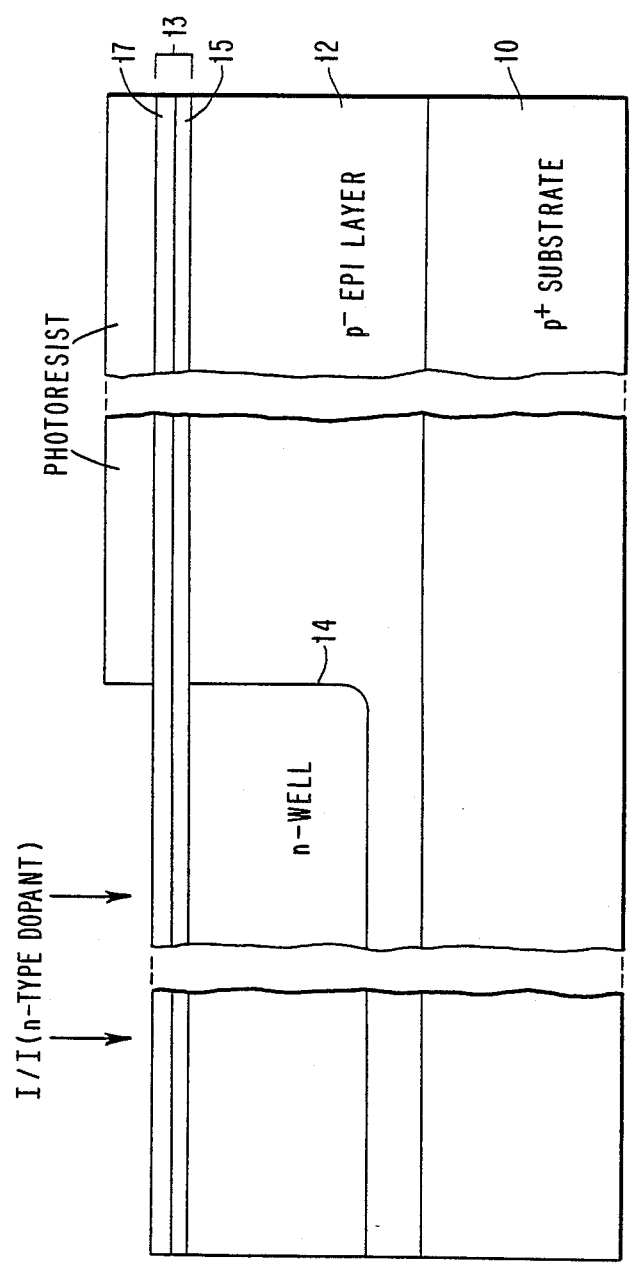
FIGS. 3, 4, 5, 6, 7, 8, 9, 10, 11, 12 and 13 show schematic cross-sectional views illustrating various stages in the fabrication of the trench-transistor CMOS structure of FIG. 1 and FIG. 2 employing a method according to the principles of the present invention.

An embodiment of a novel process sequence to fabricate the vertical n- and p- channel MOS field-effect transistors (NMOS and PMOS) is described in the following steps:

(Step 1) A p− doped monocrystalline silicon film 12 is grown epitaxially on p+ doped substrate 10. A composite layer 13 of pad $SiO_2$ 15 and $Si_3N_4$ 17 is formed on epitaxial layer 12. After suitable lithography and photoresist steps, an opening is made in the photoresist layer to expose the regions for n-well formation. Then n-type dopants are implanted through the composite layer of $SiO_2$ and $Si_3N_4$ on the substrate to form retrograde n-well 14 regions. Photoresist outside the n-well region blocks the n-type implantation. After the photoresist is removed, a short thermal cycle is used to drive in the n-type dopant into the p− epi layer 12 (FIG. 3).

Figure 4:
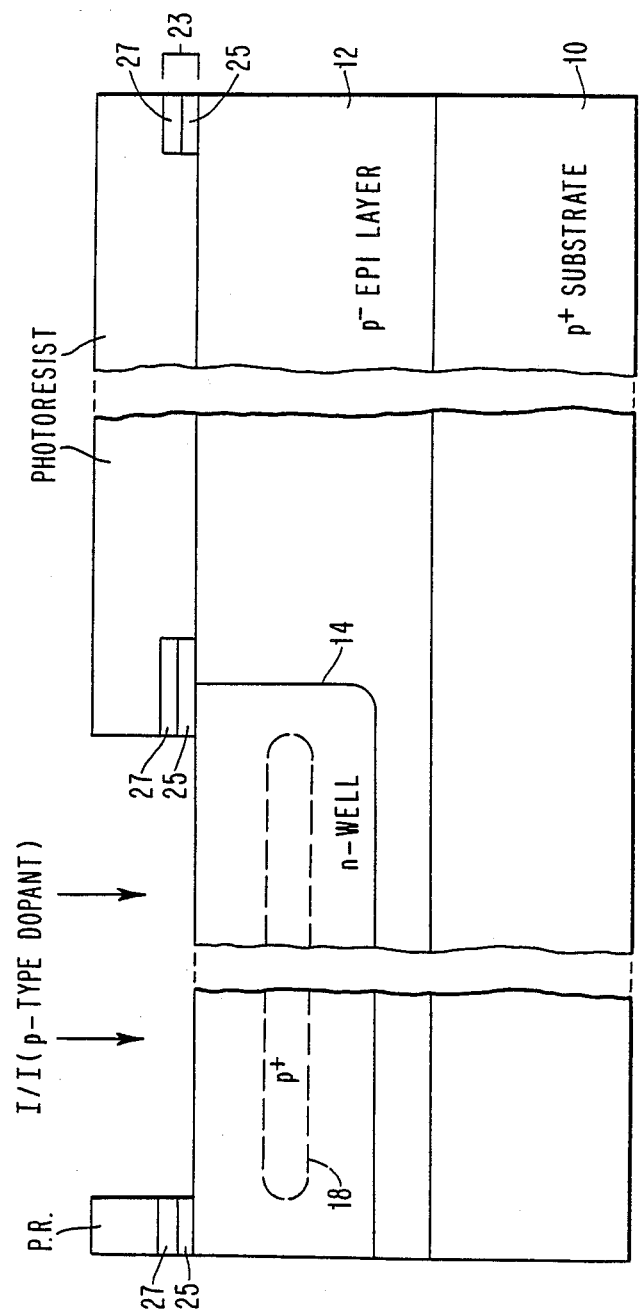
Figure 5:
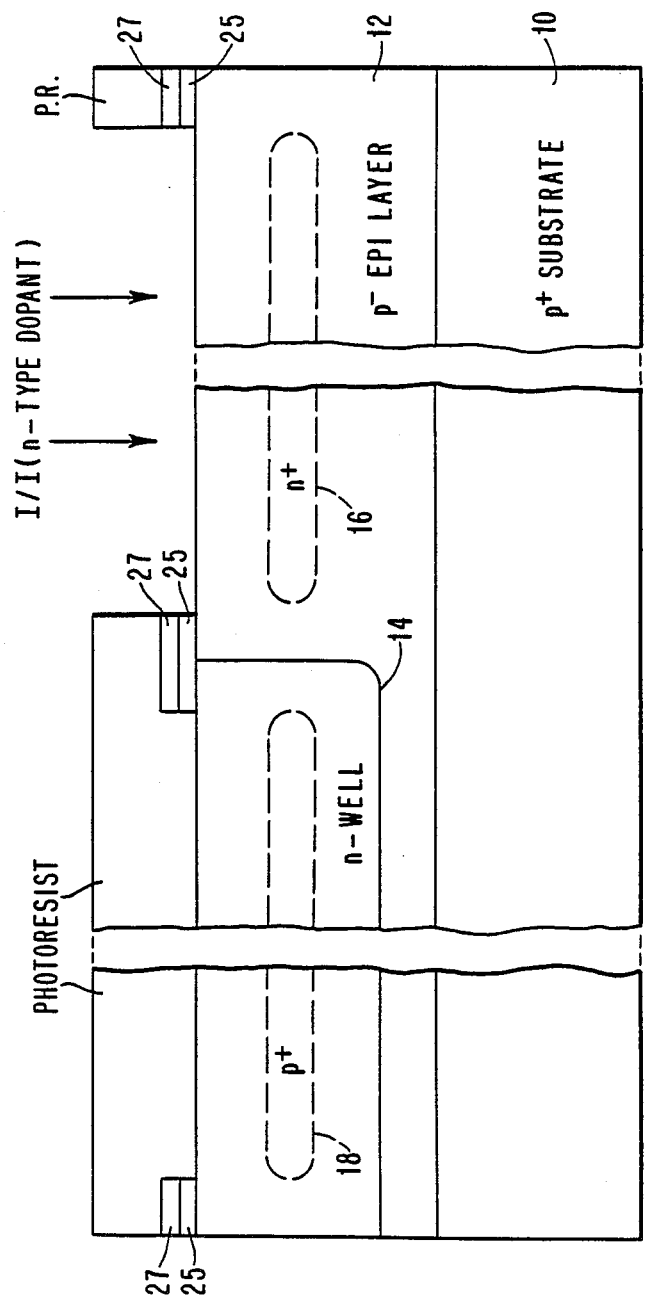

(Step 2) A composite layer 23 of $SiO_2$ 25 and $Si_3N_4$ 27 is formed on epitaxial layer 12. After suitable lithography and photoresist steps, then p-type dopants are implanted through the composite layer of $SiO_2$ and $Si_3N_4$ on the surface of n-well to form a p+ buried junction region 18. Then the composite layer of $SiO_2$ and $Si_3N_4$ is removed. The p+buried junction region 18 will be formed as a common p+ source junction of the vertical p-channel (PMOS) trench-transistor (FIG. 4). Next, after suitable lithography and photoresist steps, then n-type dopants are implanted through the composite layer of $SiO_2$ and $Si_3N_4$ on the surface of outside n-well region to form a n+ buried junction region 16. Then the composite layer of $SiO_2$ and $Si_3N_4$ is removed. The n+ buried junction region 16 will be formed as a common n+ source junction of the vertical n-channel (NMOS) trench-transistor (FIG. 5).

Figure 6:
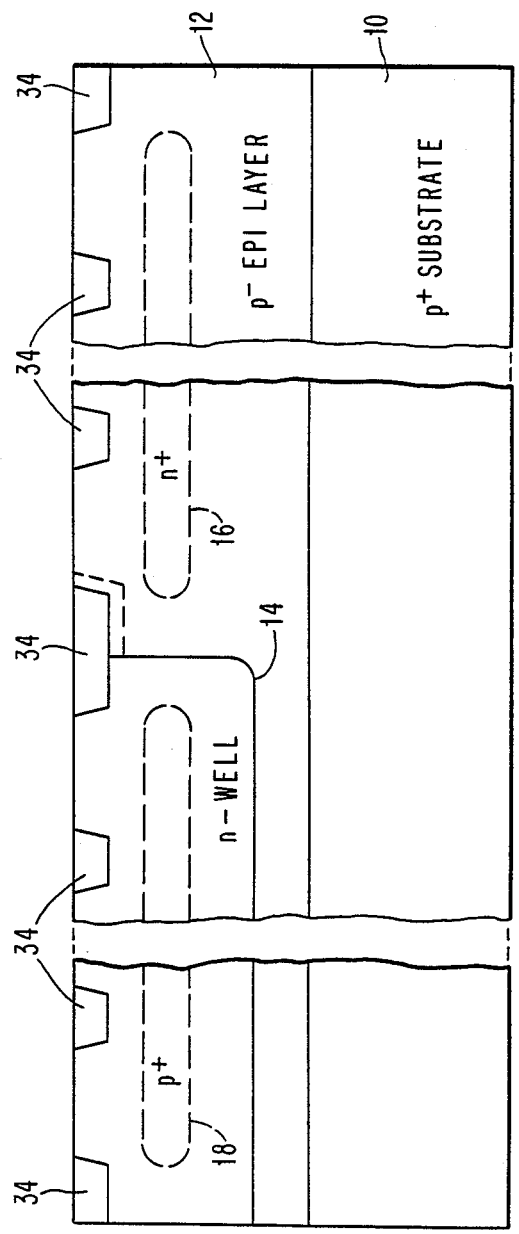

(Step 3) A composite layer of pad $SiO_2$ and $Si_3N_4$ is formed on the substrate. After suitable lithography and photoresist steps, then p-type field dopants are implanted through the composite layer of $SiO_2$ and $Si_3N_4$ on the surface of substrate. After suitable lithography and photoresist steps, the composite layer which remains is then used to mask the etch of a shallow trench isolation 34 into substrate 10 by RIE (reactive ion etching). A thin oxide is grown over the shallow trench isolation 34 surface, followed by depositing a thick oxide layer to fill the shallow trench isolation and planarization to result in a coplanar surface between the oxide isolation 34 and substrate surface (FIG. 6).

Figure 7:
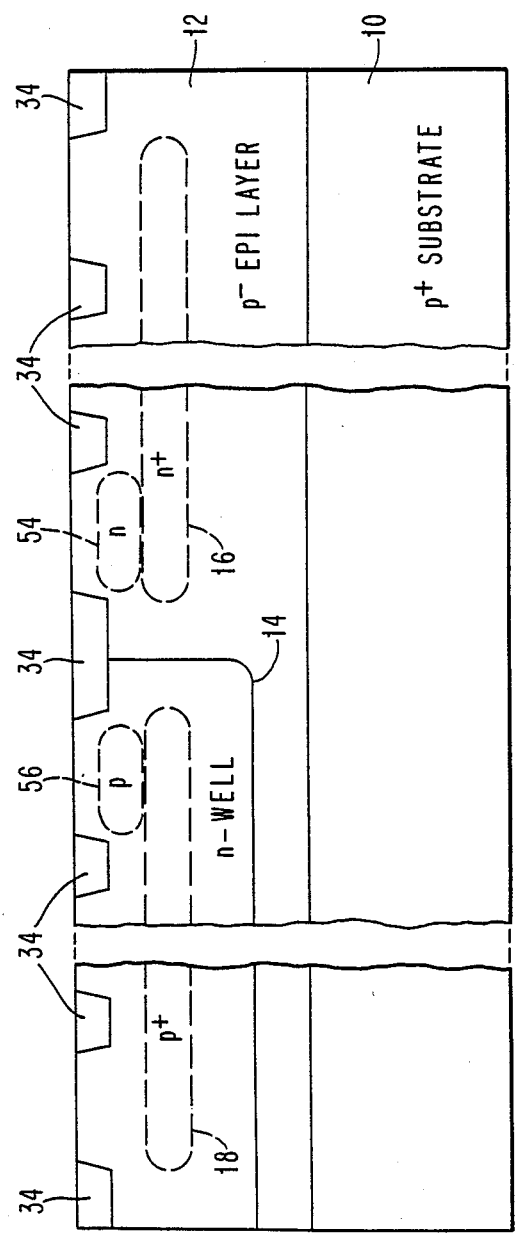

(Step 5) A composite layer of pad $SiO_2$ and $Si_3N_4$ is formed on epitaxial layer 12. After suitable lithography and photoresist steps, then medium p-type dopants are implanted through the composite layer of $SiO_2$ and $Si_3N_4$ on the surface of n-well to form a buried p-channel threshold-controlled region 56. Next, after suitable lithography and photoresist steps, then medium n-type dopants are implanted through the composite layer of $SiO_2$ and $Si_3N_4$ on the surface of outside n-well region to form a buried n-channel threshold-controlled region 54. Then the composite layer of $SiO_2$ and $Si_3N_4$ is removed (FIG. 7).

Figure 8:
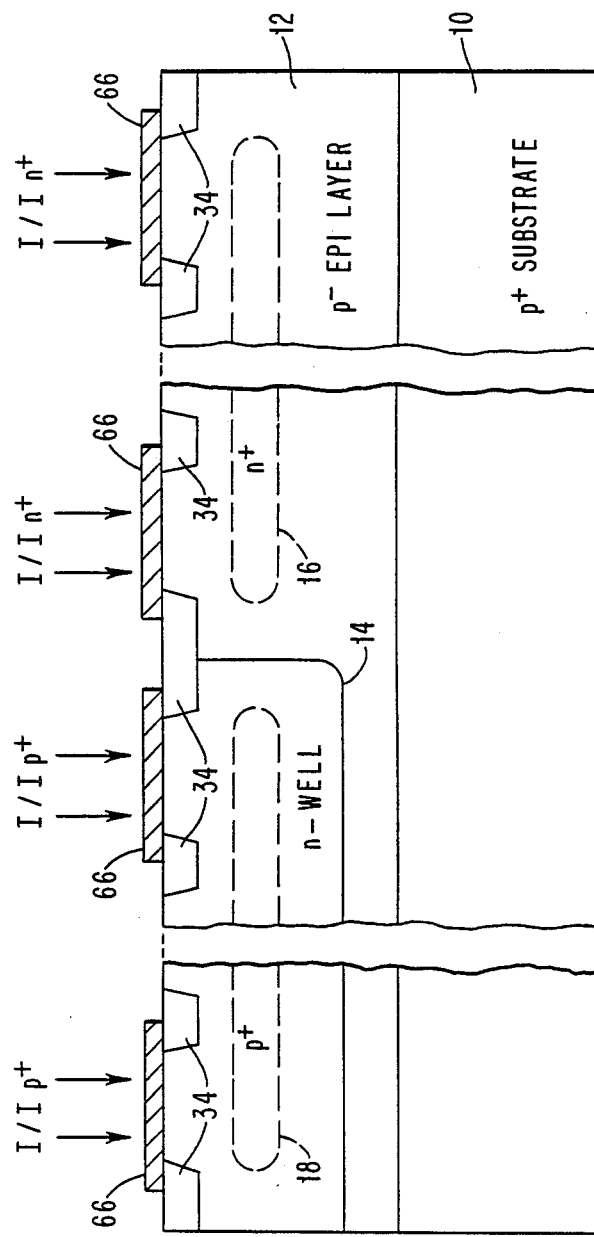

(Step 6) A thin lightly doped polysilicon layer 66 is deposited on the surface of the epitaxial layer 12. Then a composite layer of pad $SiO_2$ and $Si_3N_4$ is formed on polysilicon layer 66. After suitable lithography and photoresist steps, then p-type dopants are implanted through the composite layer of $SiO_2$ and $Si_3N_4$ on the surface of n-well to form p+ doped polysilicon 60 self-aligned contact regions. Next, after suitable lithography and photoresist steps, then n-type dopants are implanted through the composite layer of $SiO_2$ and $Si_3N_4$ on the surface of outside n-well region to form n+doped polysilicon 58 self-aligned contact regions. Then the composite layer of $SiO_2$ and $Si_3N_4$ is removed (FIG. 8).

Figure 9:
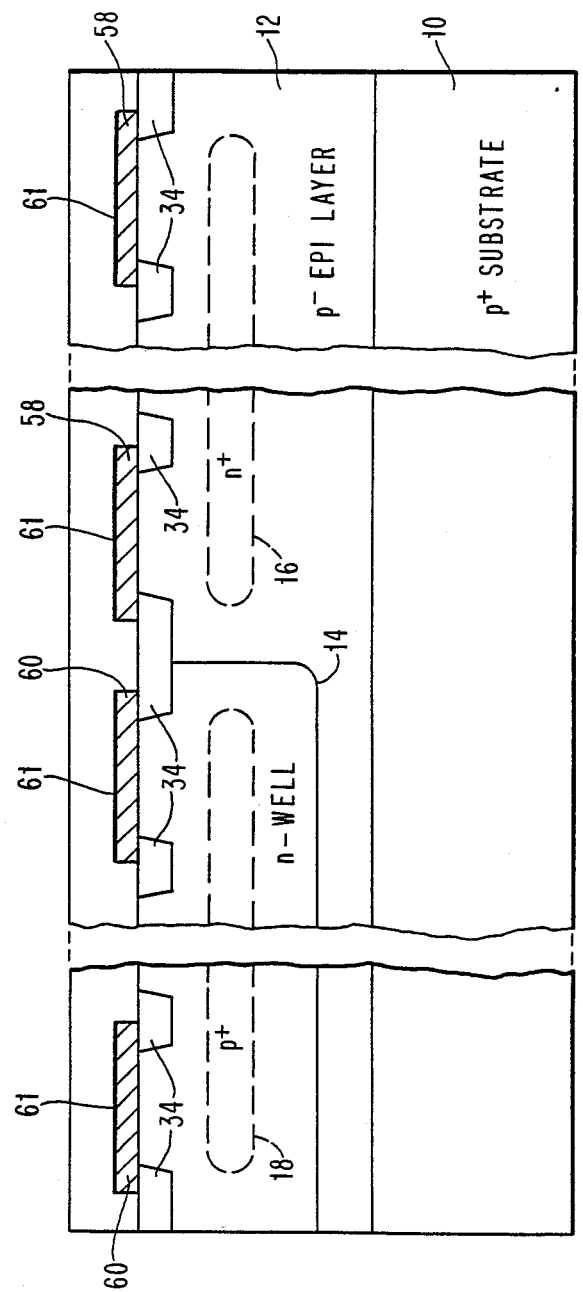

(Step 7) A thin metal film (e.g., titanium) is deposited on the surfaces of the eptiaxial layer 12 and polysilicon layers. The metal silicide (e.g., titanium silicide) is formed over the exposed polysilicon areas under a proper heat treatment. Then the remaining unreacted metal (titanium) film is oxidized by heating in oxygen at proper temperatures for a period of time. A thick metal oxide (titanium oxide) which can act as an etch stop is formed. Next, a thick low pressure CVD silicon oxide layer 38 is blanketed over the surface of the substrate 10 (FIG. 9).

Figure 10:
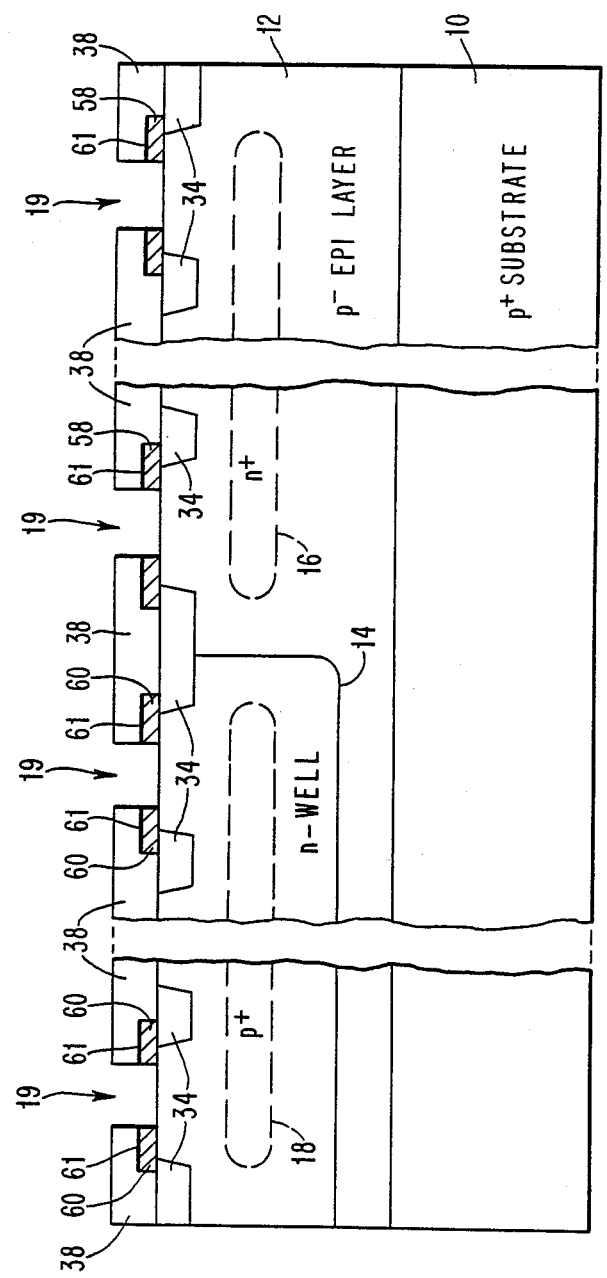

(Step 8) After suitable lithography steps, an opening is made in the silicon oxide layer 38. The silicon oxide layer 30 which remains is then used to mask the etch of gate opening areas 19 into silicide 61 and polysilicon layers, 58 and 60 by using two different reactive ion etch (RIE) steps (FIG. 10).

Figure 11:
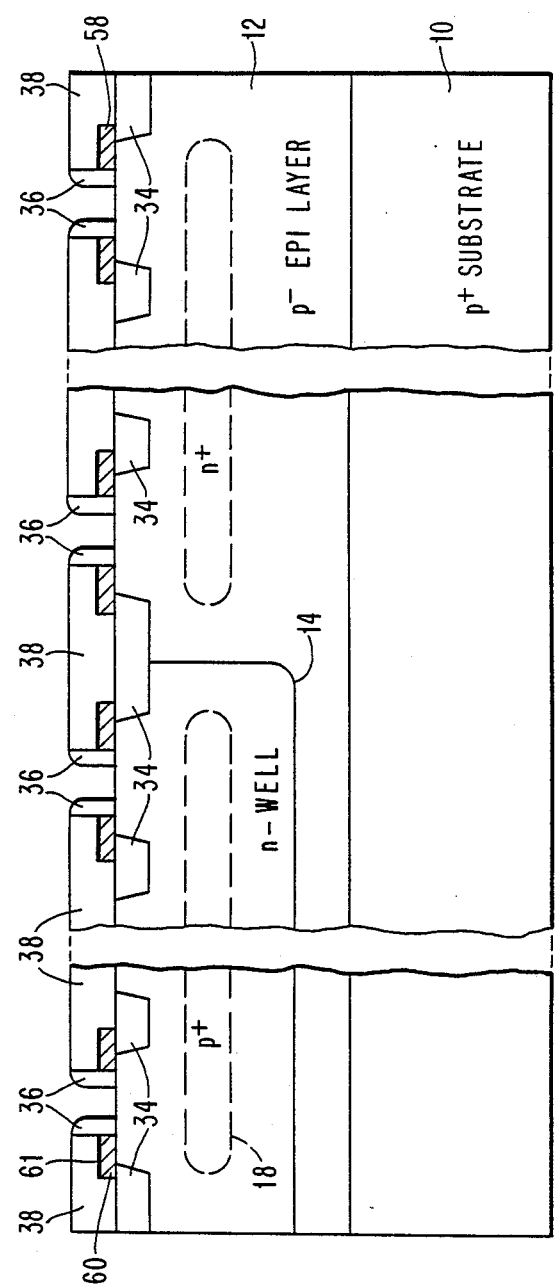

(Step 9) A silicon nitride layer is chemically deposited over the surface of substrate. The sidewall silicon nitride spacer 36 is formed by RIE nitride at proper treatments (FIG. 11).

Figure 12:
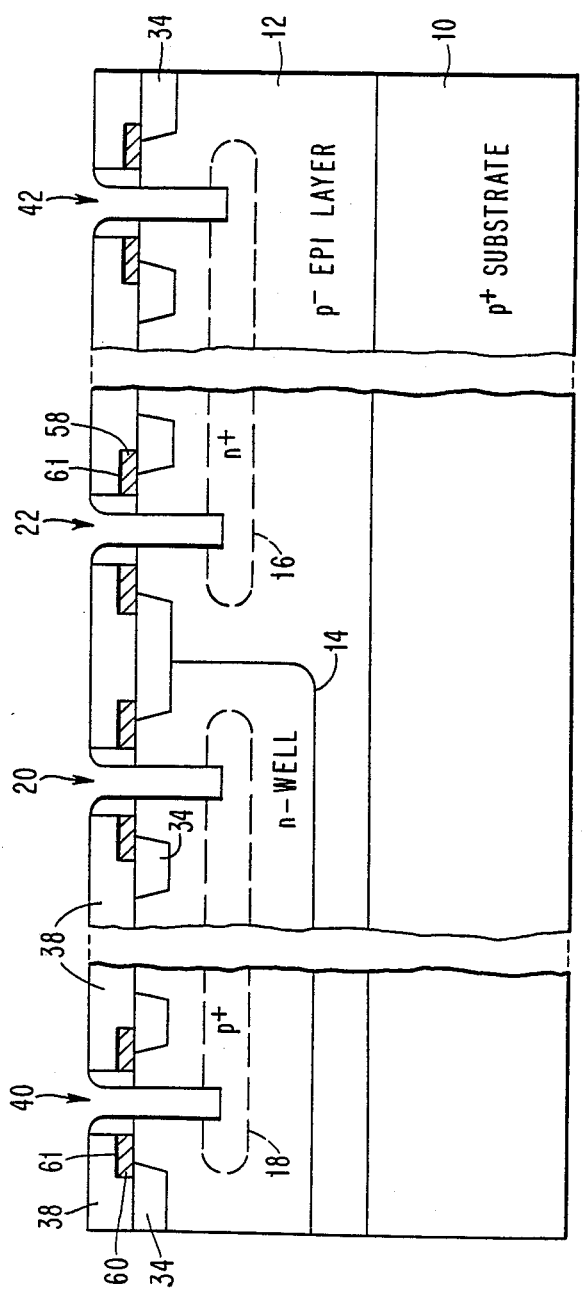

(Step 10) The sidewall nitride spacer is then used to mask the etch shallow trench using RIE into the substrate 10 to form vertical transistor regions 20, 22, 40, and 42. The depth of this shallow trench is designed to connect to the buried source region (FIG. 12).

Figure 13:
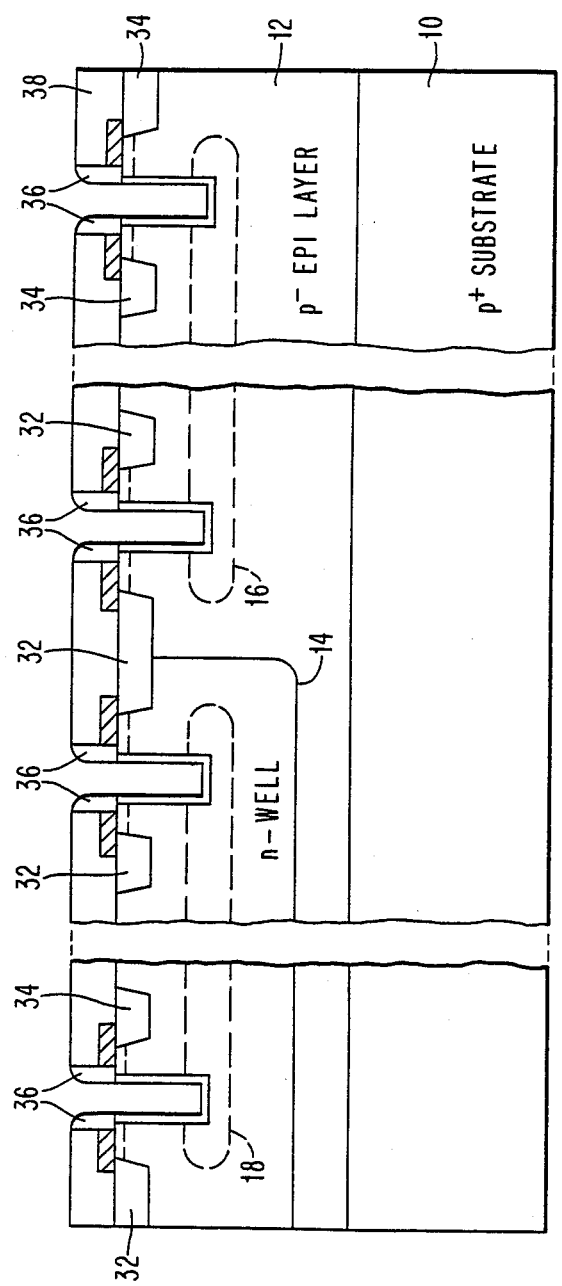

(Step 11) Grow a thin gate oxide on the vertical walls at the shallow trench and on the other area. Because of the high diffusivity of thin n+ and p+ polysilicons, the self-aligned drain junctions of the vertical n-channel and p-channel transistors are formed automatically through this hot temperature cycle (FIG. 13). The thin gate oxide of the reach-through trench acts as the transfer gate oxide of the trench-transistors.

(Step 12) Fill shallow trench with CVD n+ polysilicon or metal (e.g., tungsten), chem-mech polishing and pattern to form the transfer gate and the contact. The rest of the fabrication processes are kept the same as standard CMOS technology to complete the chip fabrication procedures. The final cross section of the trench CMOS device and strapping transistor is shown in FIG. 1. It should be noted that planar transistors can also be fabricated and incorporated with vertical transistors. Thus, the planar transistor can be used for performance-driven circuits. And it is preferred that the vertical transistor is employed for density-driven or pitch-limited circuits.

The function of the strapping transistors 40 and 42 is to input the power supply voltage to the buried source regions of the vertical transistors.

The advantages of the integrated trench-transistor technology in particular applications and embodiments are described hereinbelow.

Figure 14:
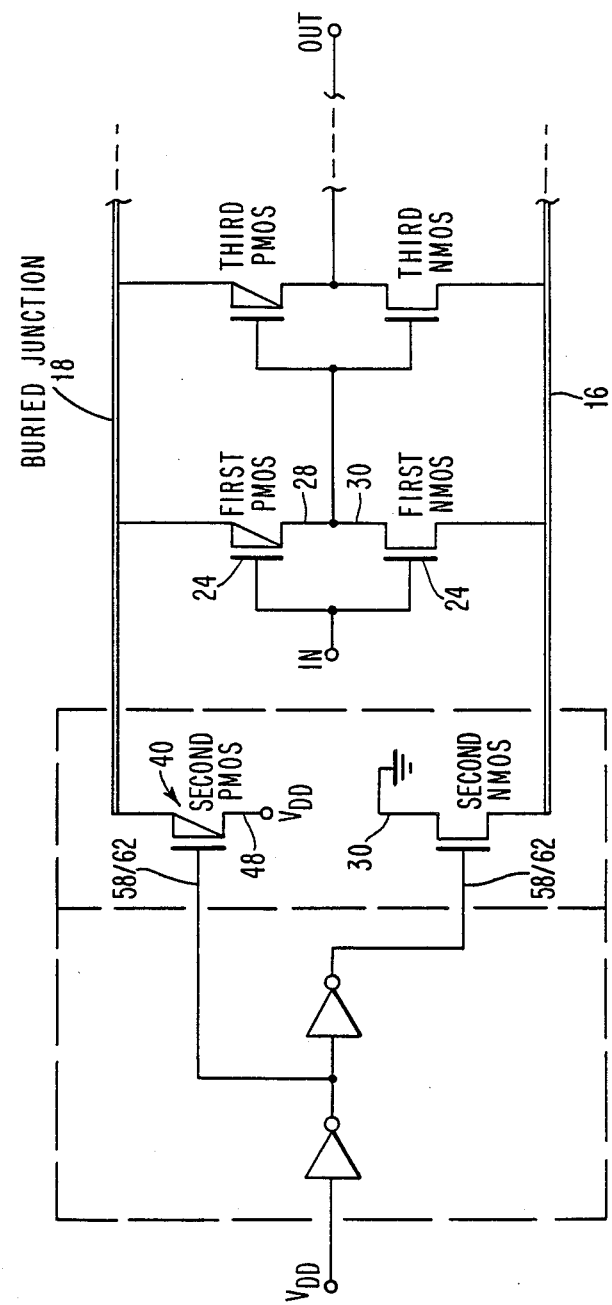
FIG. 14 is a schematic circuit diagram illustrating the trench-transistor CMOS structure of the present invention employed as an inverter.
Figure 15:
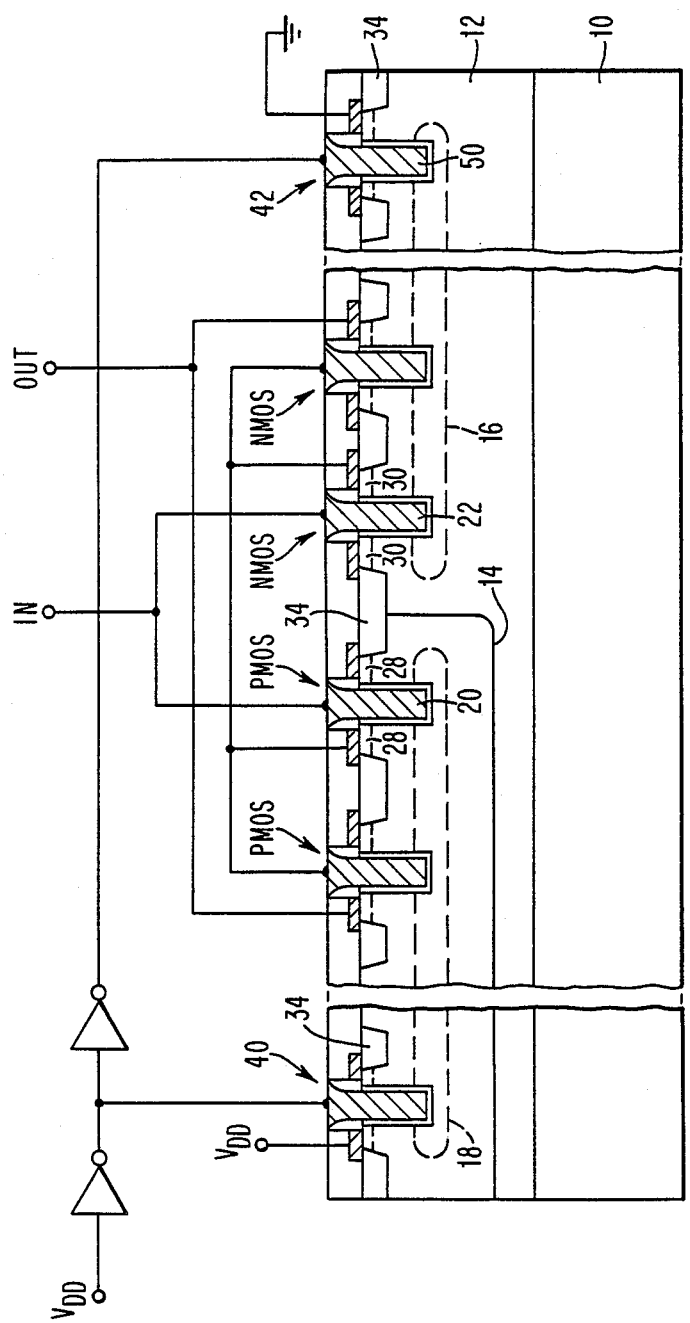
FIGS. 15 and 16 are schematic illustrations of the vertical cross sections and plan view of the inverter circuit of FIG. 14.
Figure 16:
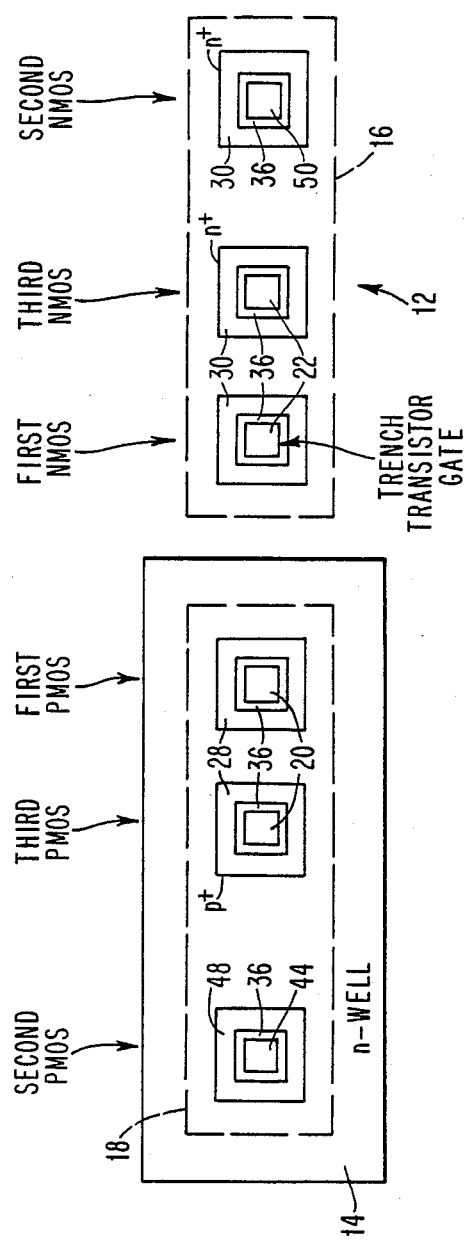

Trench CMOS Inverters Design: FIG. 14 is an example of a set of vertical CMOS inverters. Referring to FIG. 14, an application of the vertical CMOS devices of the present invention as inverters is shown. The VDD voltage is supplied to the gates and drains of the strapping transistors 40, 42 through hardwires when the power supply is ramped up. In this case, the voltage may also be supplied through a chain of inverters if planar transistors were used. As a result, both strapping transistors are turned on so that the VDD and ground can be supplied to the buried source regions. The cross section and its layout of the inverter are shown in FIGS. 15 and 16, respectively. For simplicity, its cross section only shows the front-end-of-the-line. The NMOS acts as driver and PMOS acts as load. Two MOSFETs are in series with drain tied together and output taken from this node to connect to the next stage. The two gates are connected and the input is applied to the common gate. The buried sources 16 and 18 of NMOS and PMOS are connected to the power supply and ground through the two different strapping transistors, respectively. The reduction of the layout areas are clearly demonstrated.

Figure 17:
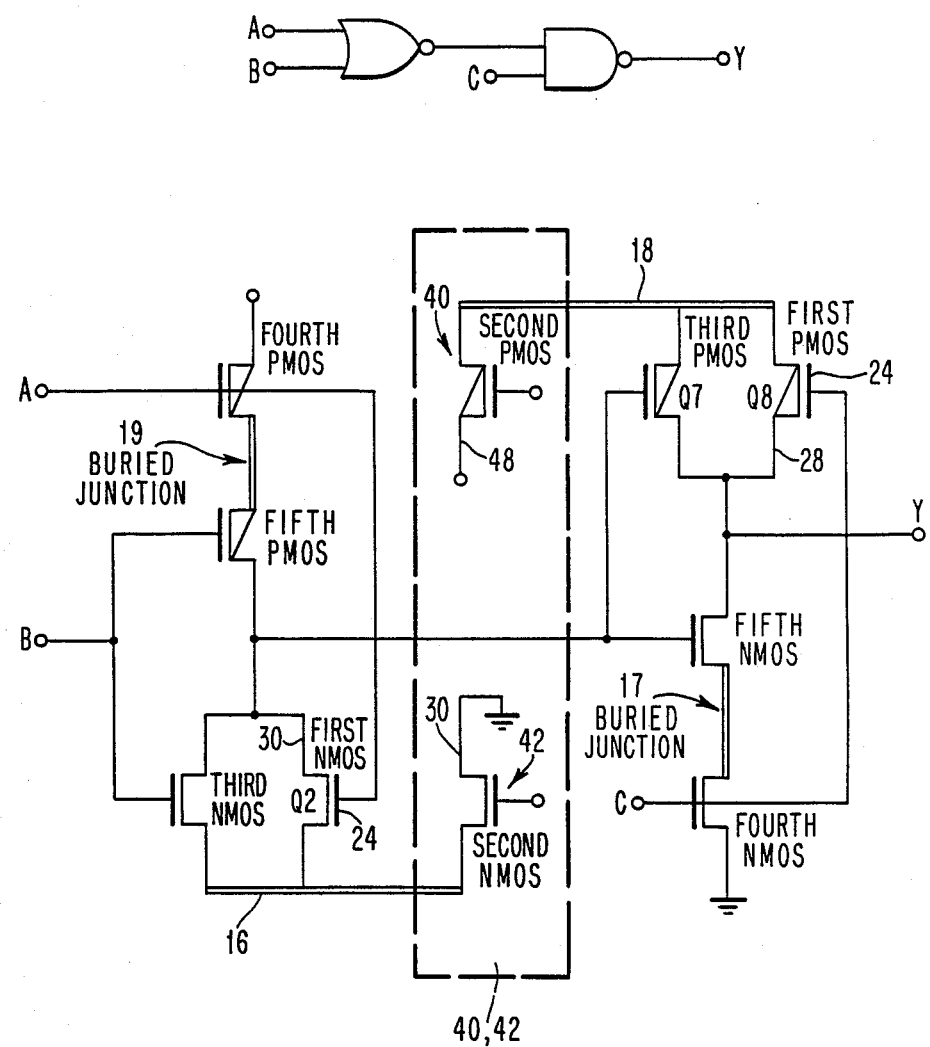
FIG. 17 is a schematic circuit diagram illustrating the trench-transistor CMOS structure of the present invention employed as a combination NOR-NAND gate.
Figure 18:
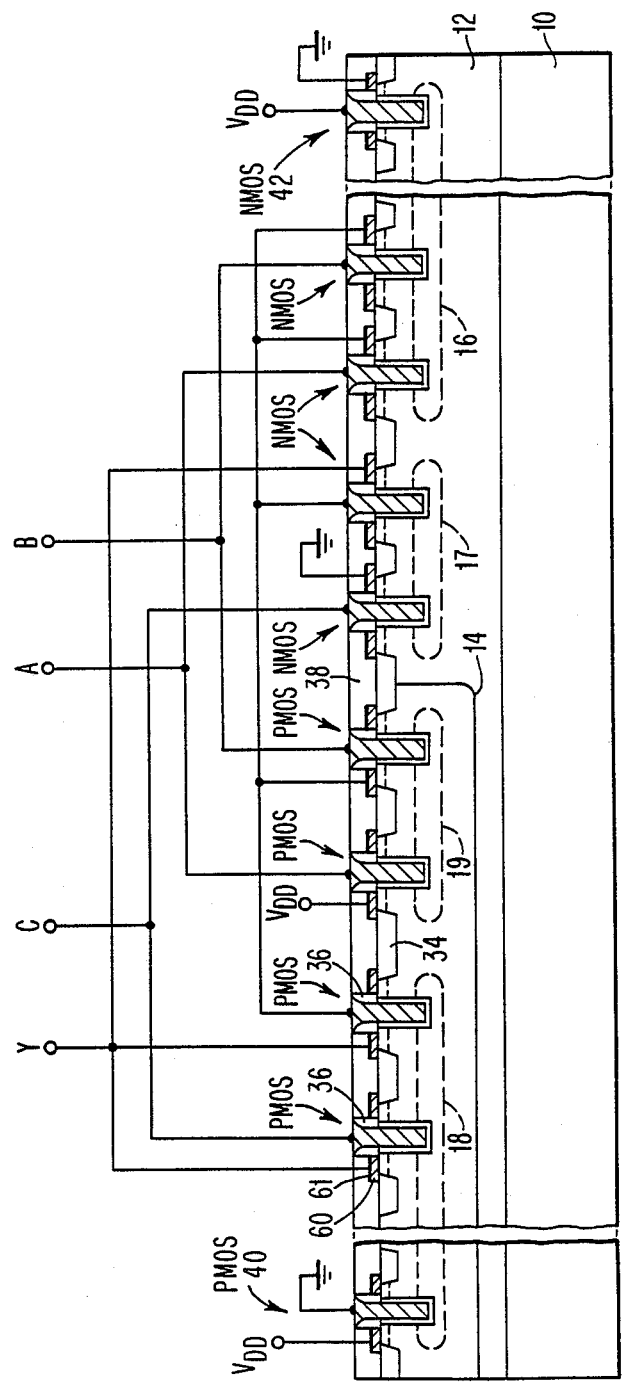
FIGS. 18 and 19 are schematic illustrations of the vertical cross sections and plan view of the inverter circuit of FIG. 17.
Figure 19:
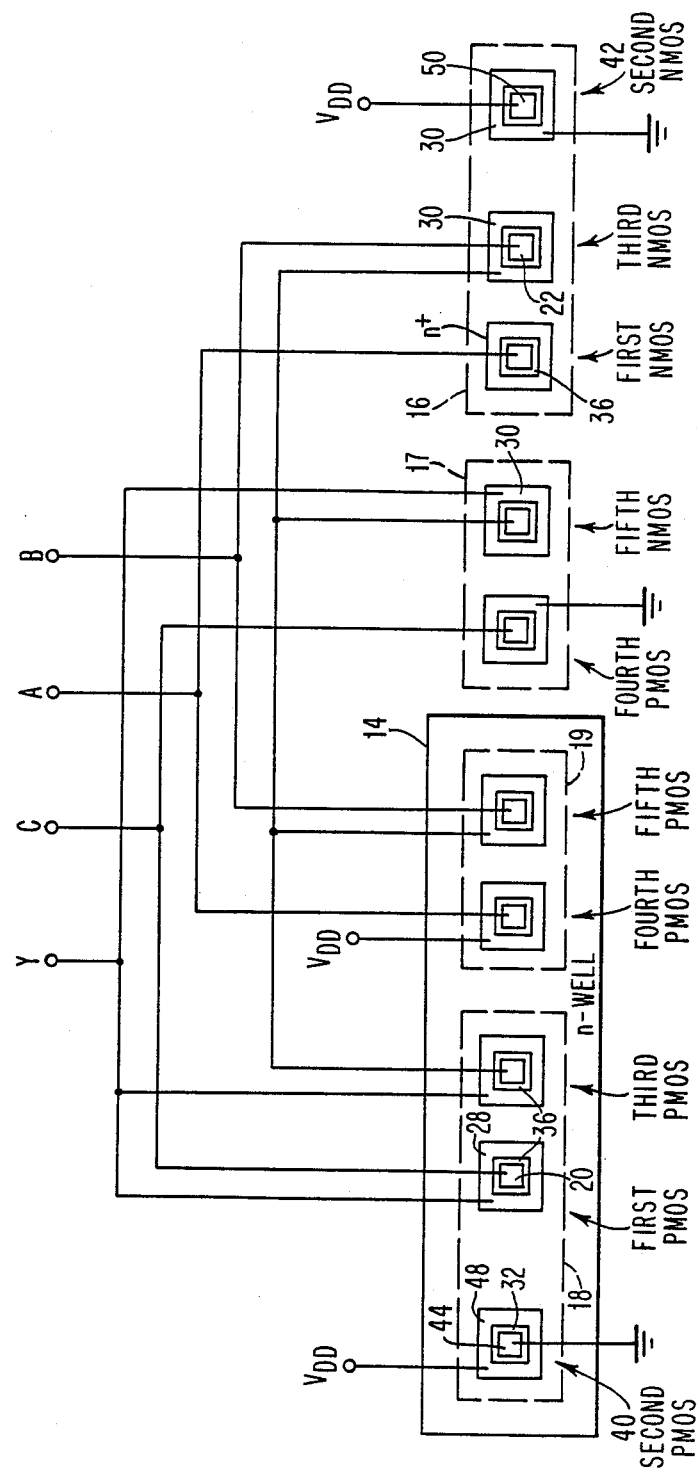

Trench CMOS NOR and NAND Gate Design: A vertical CMOS NOR gate is obtained by connecting NMOS drivers in parallel and PMOS loads in series. A vertical CMOS NAND gate is obtained by connecting NMOS drivers in series whereas the corresponding PMOS loads are placed in parallel. The configuration of the combination of NOR-NAND gate is shown in FIG. 17. The cross section of this gate and its layout are shown in FIGS. 18 and 19, respectively. There are two types of buried junctions: one type serves as the intraconnection islands 17 and 19 of two vertical transistors, its potential level is left floating; and the other type serves as the common sources 16 and 18 of the vertical transistors and is connected to the outside world through the "strapping transistors". The biasing conditions for each strapping transistors (NMOS and PMOS) are shown in FIGS. 18 and 19.

Vertical Interdigated Layout Design: The effective channel length of the vertical transistor is determined by the thickness of epitaxial layer minus the shallow drain junction depth. For a larger sized vertical MOS transistor, the new interdigated layout method should be used.

Figure 22:
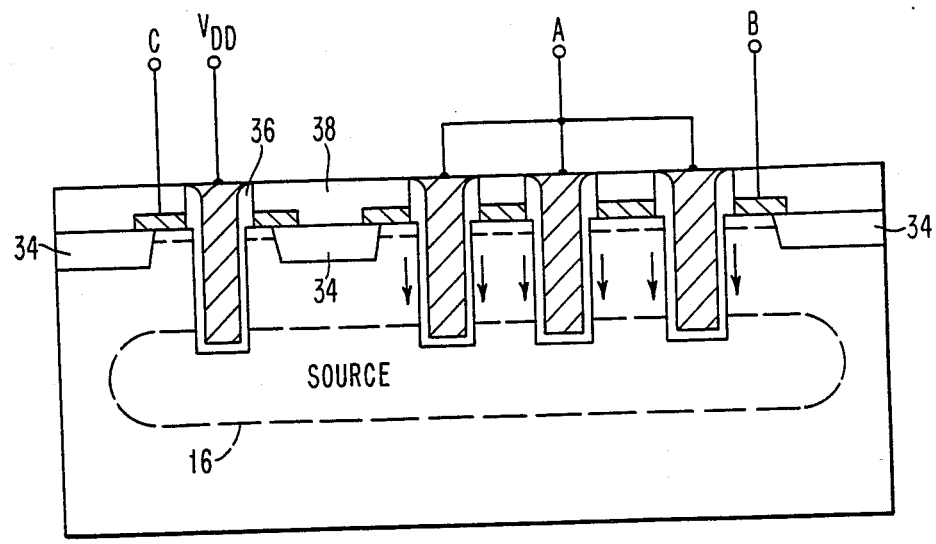
FIGS. 22 and 23 are schematic illustrations of the vertical cross sections and plan view of the structure of FIG. 21.
Figure 23:
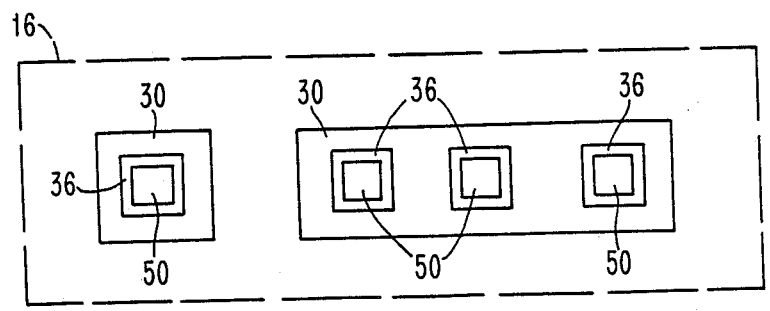

The circuit diagram of a typical example of a vertical transistor with larger W/L ratio is shown in FIG. 20 together with its cross section and layout diagrams (FIGS. 21 and 22). Here again, the strapping transistor is built on top of the buried source junction and is biased to any controllable voltage levels. The gates of active transistors are folded in the vertical direction and the drains of the active transistors are shared with the same top drain junction. All the isolation regions between each drain regions are saved. This method will lead to the advantages of reduction of transistor area, higher packing density and the flexibility in circuit layout design.

The integrated vertical CMOS devices are now available to perform a wide variety of logic and memory functions, for example: flip-flops, registers, decoders and SRAM cells.

Having thus described our invention, what we claim as new, and desire to secure by Letters Patent is:

1. An integrated, self-aligned trench-transistor structure comprising:
    a substrate of semiconductor material,
    a layer of epitaxial material,
    a well region disposed in said epitaxial layer,
    a first source element region disposed in said well region,
    a second source element region disposed in said epitaxial layer proximate to said well region,
    a first trench disposed in said epitaxial layer and into said first source element in said well region, said first trench being filled with conductive material to form a first gate element region,
    a second trench disposed in said epitaxial layer and into said second source element region, said second trench being filled with conductive material to form a second gate element region,
    a first drain element region disposed in the surface of said epitaxial layer around said first filled trench,
    a second drain element region disposed in the surface of said epitaxial layer around said second filled trench,
    said first filled trench gate element region, said first source element region and said first drain element region forming a first conductivity type vertical transistor,
    said second filled trench gate element region, said second source element region and said second drain element region forming a second conductivity type vertical transistor,
    a region of conductive material connecting said conductive gate material in said first trench and said conductive gate material in said second trench,
    a third trench disposed in said epitaxial layer and into said first source element region in said well region proximate to said first trench, said third trench being filled with conductive material to form a third gate element region, and
    a third drain element region disposed in the surface of said epitaxial layer around said third trench,
    said third trench gate element region, said first source element region and said third drain element region forming a first conductivity type vertical trench strapping transistor for providing bias signal to said first source element region.

2. An integrated, self-aligned trench transistor structure according to claim 1 further including a fourth trench disposed in said epitaxial layer and into said second source element region, proximate to said trench, said fourth trench being filled with conductive material to form a fourth gate element region,
    a fourth drain element region disposed in the surface of said epitaxial layer around said fourth trench, and
    said fourth filled trench gate element region said second source element region ad said fourth drain element region forming a second conductivity type vertical trench strapping transistor for providing a bias signal to said second source element.

3. An integrated, self-aligned trench-transistor structure according to claim 2 wherein said epitaxial layer is composed of p-type material, said well region is composed of n— material, said first source element region is composed of p+ material, and
    said first drain element region is composed of p+ material to form in combination with said first trench gate element a vertical p-channel first PMOS trench-transistor and
    wherein said second source element region is composed of n+ material, and
    said second drain element region is composed of n+ material to form in combination with said second trench gate element a vertical n-channel first NMOS trench-transistor.

4. An integrated, self-aligned trench-transistor structure according to claim 3 further including a layer of oxide isolation material disposed over said epitaxial layer, said oxide layer having openings located over said first and second trenches wherein said openings in said oxide layer are filled with conductive material in contact with said conductive material in said first and second trenches, and
  wherein said conductive material disposed in said openings in said oxide layer are isolated from said oxide layer by vertical nitride spacer regions disposed in said openings.

5. An integrated, self-aligned trench-transistor structure according to claim 4 wherein said first and second trenches include a layer of isolation material on the walls thereof, and wherein a region of isolation material is disposed in the surface of said epitaxial layer intermediate said PMOS and NMOS vertical trench-transistors.

6. An integrated, self-aligned trench-transistor structure according to claim 3 wherein said third drain element region is composed of p+ material to form in combination with said first p+ material source element region and said third trench gate element region a vertical second PMOS strapping transistor.

7. An integrated, self-aligned trench-transistor structure according to claim 6 wherein said fourth drain element region is composed of n+ material to form in combination with said second n+ material source element region and said fourth trench gate element region a vertical second NMOS strapping transistor.

8. An integrated, self-aligned trench-transistor structure according to claim 7 further including a layer of oxide isolation material disposed over said epitaxial layer, said oxide layer having openings located over said first, second, third and fourth trenches wherein said openings in said oxide layer are filled with conductive material in contact with said conductive material in said first, second, third and fourth trenches, and
  wherein said conductive material disposed in said openings in said oxide layer are isolated from said oxide layer by vertical nitride spacer regions disposed in said openings.

9. An integrated, self-aligned trench-transistor structure according to claim 7 wherein said third and fourth trenches include a layer of isolation material on the walls thereof, and
  wherein regions of isolation material are disposed on the surface of said epitaxial material between said first and third trenches and said second and fourth trenches.

10. An integrated, self-aligned trench-transistor structure according to claim 9 further including
  said first source element in said epitaxial layer having drain and gate elements similar to said first PMOS vertical transistor,
  a third NMOS vertical transistor deposited in said second source element in said epitaxial layer having drain and gate elements similar to said first NMOS vertical transistor,
  means for connecting a voltage source to said gate elements of said second PMOS vertical strapping transistor and said second NMOS vertical strapping transistor,
  means for connecting a voltage source to said third drain element of said second PMOS vertical strapping transistor,
  means for connecting a reference potential to said fourth drain element of said second NMOS strapping transistor,
  an input signal terminal connected to said first and second gate elements of said first PMOS and first NMOS vertical trench-transistors, and
  an output signal terminal connected to said drain elements of said third PMOS and third NMOS vertical transistors to provide a CMOS inverter structure.

11. An integrated, self-aligned trench-transistor structure according to claim 9 further including
  a third source element disposed proximate to said first source element in said n-well region in said epitaxial layer,
  a fourth source element disposed in said epitaxial layer proximate to said second source element,
  a third PMOS vertical transistor disposed in said first source element in said epitaxial layer having drain and gate elements similar to said first PMOS vertical transistor,
  a third NMOS vertical transistor disposed in said second source element in said epitaxial layer having drain and gate elements similar to said first NMOS vertical transistor,
  fourth and fifth PMOS vertical transistors disposed in said third source element and having drain and gate elements similar to said first, second and third PMOS vertical transistors,
  fourth and fifth NMOS vertical transistors disposed in said fourth source element and having drain and gate elements similar to said first, second and third NMOS vertical transistors,
  means for connecting a voltage source to said third drain element of said second PMOS strapping transistor and to said third gate element of said second NMOS strapping transistor,
  means for connecting a reference source to said third gate element of said second PMOS strapping transistor and to said third drain element of said second NMOS strapping transistor,
  means for connecting said gate elements of said first NMOS and fourth PMOS vertical transistors together to a first input terminal,
  means for connecting said gate elements of said third NMOS and fifth PMOS vertical transistors together to a second input terminal,
  means for connecting said gate element of said fourth NMOS and first PMOS vertical transistor together to a third input terminal,
  means for connecting said gate elements of said third PMOS vertical transistor, said drain element of said fifth PMOS vertical transistor, said gate element of said fifth NMOS and said drain element of said third NMOS transistor together, and
  means for connecting said drain elements of said first PMOS, third PMOS and fifth NMOS vertical trench-transistors to an output terminal to provide a vertical CMOS NOR/NAND gate structure.

* * * * *